United States Patent
Ott

(10) Patent No.: US 9,408,291 B2
(45) Date of Patent: Aug. 2, 2016

(54) CONTROL MODULE AND METHOD FOR PRODUCING SAME

(75) Inventor: Harald Ott, Freiberg am Neckar (DE)

(73) Assignee: Robert Bosch GmbH, Stuttgart (DE)

( * ) Notice: Subject to any disclaimer, the term of this patent is extended or adjusted under 35 U.S.C. 154(b) by 317 days.

(21) Appl. No.: 13/991,485

(22) PCT Filed: Oct. 20, 2011

(86) PCT No.: PCT/EP2011/068311
§ 371 (c)(1),
(2), (4) Date: Aug. 16, 2013

(87) PCT Pub. No.: WO2012/076232
PCT Pub. Date: Jun. 14, 2012

(65) Prior Publication Data
US 2013/0314878 A1    Nov. 28, 2013

(30) Foreign Application Priority Data

Dec. 8, 2010  (DE) .......................... 10 2010 062 653

(51) Int. Cl.
*H05K 7/20* (2006.01)
*H05K 1/02* (2006.01)
(Continued)

(52) U.S. Cl.
CPC ................ *H05K 1/02* (2013.01); *H05K 1/0203* (2013.01); *H05K 1/0209* (2013.01); *H05K 3/284* (2013.01);
(Continued)

(58) Field of Classification Search
CPC . G06F 1/181–1/182; H05K 7/20218–7/20381; H05K 7/20409–7/20418; H05K 7/20009–7/202; H01L 23/46–23/3677
USPC ........................ 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS 6,195,267 B1 * 2/2001 MacDonald, Jr. ...... H01L 23/42
174/377
8,059,425 B2 * 11/2011 Huang .................. H05K 3/284
310/344

(Continued)

FOREIGN PATENT DOCUMENTS

CN          1358411 A      7/2002
CN        101080338 A     11/2007

(Continued)

OTHER PUBLICATIONS

International Search Report corresponding to PCT Application No. PCT/EP2011/068311, mailed Jan. 19, 2012 (German and English language document) (7 pages).

*Primary Examiner* — Anthony Haughton
*Assistant Examiner* — Razmeen Gafur
(74) *Attorney, Agent, or Firm* — Maginot, Moore & Beck LLP

(57) ABSTRACT

A control module includes a circuit board having conductor paths arranged on at least one plane and having at least one rigid, inflexible conductor path section. The control module also includes an electronic control circuit which electrically contacts the conductor paths and has electrical components. The control module also includes a pan-shaped cover part protecting the control circuit. The cover part is arranged over a part of the electronic control circuit and contacts a side of the circuit board in a sealing manner with a flat contact region aligned parallel to the side. At least part of the electronic control circuit is protectively arranged in a housing inner chamber between the cover part and the circuit board, and electrical contacts of the circuit board are provided outside of the housing inner chamber, which is covered by the cover part, to contact electrical components of the control module.

11 Claims, 5 Drawing Sheets

(51) Int. Cl.
*H05K 3/28* (2006.01)
*H05K 5/00* (2006.01)
*H05K 5/06* (2006.01)
*H01L 23/473* (2006.01)
*H05K 1/14* (2006.01)
*H05K 3/46* (2006.01)

(52) U.S. Cl.
CPC .............. *H05K 5/0082* (2013.01); *H05K 5/062* (2013.01); *H01L 2224/48091* (2013.01); *H01L 2924/19107* (2013.01); *H05K 1/141* (2013.01); *H05K 3/4691* (2013.01); *H05K 2201/10371* (2013.01); *H05K 2203/0776* (2013.01)

(56) References Cited

U.S. PATENT DOCUMENTS

| | | | | |
|---|---|---|---|---|
| 2001/0032738 | A1* | 10/2001 | Dibene, II | G06F 1/18 174/260 |
| 2002/0105071 | A1* | 8/2002 | Mahajan | H01L 23/36 257/720 |
| 2004/0190258 | A1* | 9/2004 | Lofland | H01L 23/4093 361/704 |
| 2005/0041398 | A1* | 2/2005 | Huemoeller | H01L 21/4857 361/721 |
| 2006/0171121 | A1* | 8/2006 | Bell | H05K 7/20509 361/704 |
| 2006/0219385 | A1* | 10/2006 | Bell | H05K 7/20445 165/80.2 |
| 2006/0227510 | A1* | 10/2006 | Fitzgerald | H01L 23/42 361/704 |
| 2009/0002945 | A1* | 1/2009 | Kenny | G01K 1/16 361/695 |
| 2009/0016034 | A1* | 1/2009 | Beer | B60R 16/0239 361/752 |
| 2009/0021917 | A1* | 1/2009 | Floyd | H01L 23/4093 361/719 |
| 2009/0059519 | A1* | 3/2009 | Ong | H05K 7/20727 361/690 |
| 2009/0086431 | A1* | 4/2009 | Sakamoto | H05K 7/20009 361/695 |
| 2009/0109624 | A1* | 4/2009 | Chan | H05K 1/0206 361/702 |
| 2009/0244831 | A1* | 10/2009 | Nemoz | H05K 7/1452 361/679.48 |
| 2010/0020495 | A1* | 1/2010 | Eglinger | B60R 16/0239 361/702 |
| 2010/0091464 | A1* | 4/2010 | Ohnishi | H01L 23/053 361/723 |
| 2010/0133001 | A1* | 6/2010 | Loibl | H01L 23/057 174/521 |
| 2010/0134975 | A1* | 6/2010 | Shimizu | H02G 3/03 361/694 |
| 2010/0142155 | A1* | 6/2010 | Mertol | H01L 23/055 361/719 |
| 2010/0164510 | A1* | 7/2010 | Abazarnia | G01R 31/2874 324/555 |
| 2010/0202110 | A1* | 8/2010 | Becker | H05K 5/0082 361/707 |
| 2010/0208425 | A1* | 8/2010 | Rapisarda | A41D 27/085 361/692 |
| 2010/0226098 | A1* | 9/2010 | Loibl | F16H 61/0006 361/721 |

FOREIGN PATENT DOCUMENTS

| | | |
|---|---|---|
| CN | 101107893 A | 1/2008 |
| CN | 101690437 A | 3/2010 |
| DE | 196 40 466 A1 | 4/1998 |
| DE | 101 61 230 A1 | 6/2003 |
| DE | 10 2005 002 813 A1 | 8/2006 |
| DE | 10 2007 019 096 A1 | 11/2008 |
| DE | 10 2007 029 913 A1 | 1/2009 |
| DE | 10 2007 032 594 A1 | 1/2009 |
| EP | 0 309 920 A2 | 4/1989 |
| EP | 1 116 422 B1 | 7/2001 |
| EP | 1 831 055 B1 | 9/2007 |
| WO | 2005/044632 A1 | 5/2005 |
| WO | 2006/066983 A1 | 6/2006 |
| WO | 2006/077208 A1 | 7/2006 |

* cited by examiner

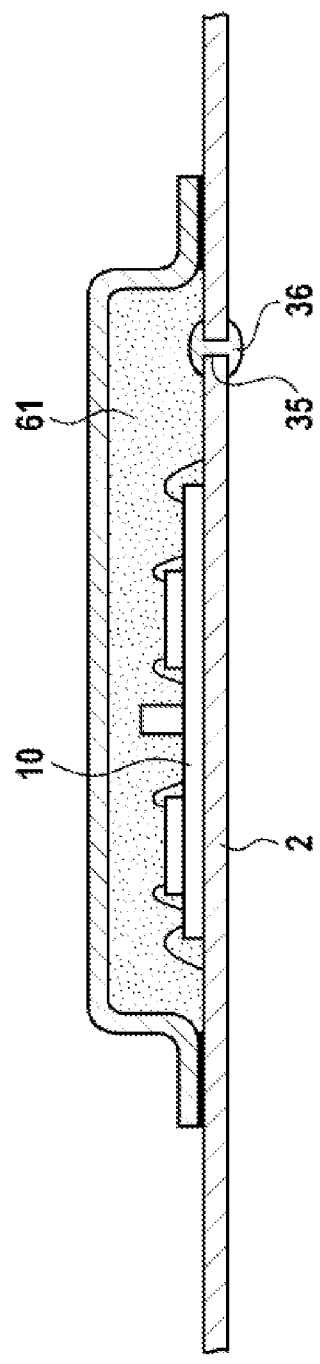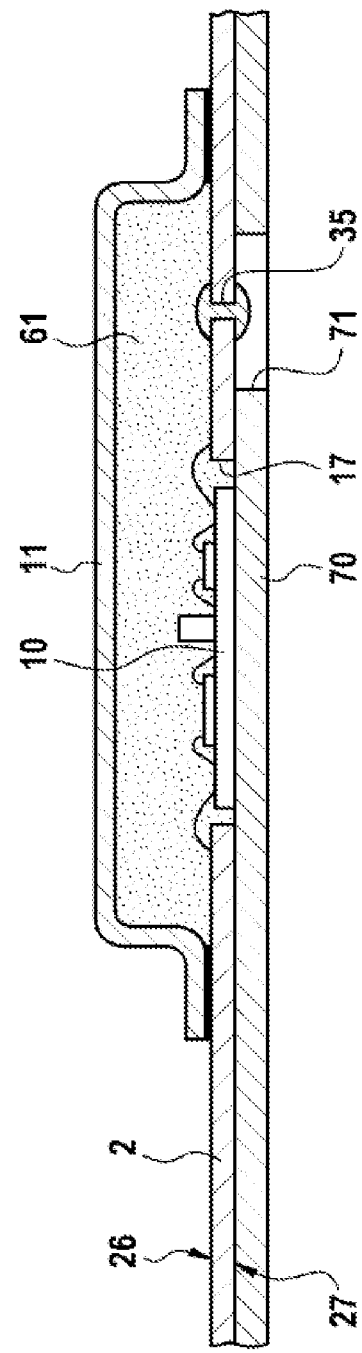

CONTROL MODULE AND METHOD FOR PRODUCING SAME

This application is a 35 U.S.C. §371 National Stage Application of PCT/EP2011/068311, filed on Oct. 20, 2011, which claims the benefit of priority to Ser. No. DE 10 2010 062 653.8, filed on Dec. 8, 2010 in Germany, the disclosures of which are incorporated herein by reference in their entirety.

BACKGROUND

The disclosure relates to a control module having the features of the description below and a method for producing same.

Control modules are known in the field of transmission control, which control modules in order to produce one modular component combine an electronic control device with a base carrier that is provided to enable the control device to contact actuators, sensors, plug connection parts or control motors in an electrical manner. Known transmission control modules frequently comprise as the base carrier a synthetic material carrier having fixed thereon metal stamped-out grid parts to provide the electrical connections. A transmission control module of this type is known for example from DE 101 61 230 A1. A control device is arranged on the transmission control module, as is known for example from DE 196 40 466 B4. The control circuit is arranged on a carrier substrate in a closed metal housing and is connected by way of contact pins in glass feed-throughs to the stamped-out grid parts of the base carrier. In addition to control modules of this type that use a base carrier on the basis of stamped-out grid parts, transmission control modules are also known that use a cabling arrangement that is fixed on a base carrier for contacting actuators, sensors and plug connector parts. WO 2005/044632 A1 for example discloses a transmission control module of this type.

In addition to the above illustrated known control modules, further types have been developed over recent years that use a flexible conductor foil for producing a contact between the electronic switching part of the control device and the different electrical components of the module. Transmission control modules of this type are disclosed, for example, in EP 1 831 055 B1 and in DE 10 2005 002 813 B4. However, the flexible conductor foils are relatively expensive. In addition, a significant expenditure is required in order to support and to protect the conductor foil and to provide a sealing arrangement between the control device and the conductor foil.

In recent years, transmission control modules have been developed that use as a base carrier a conventional rigid or also rigid-flexible circuit board on an FR4 base or on a base of a higher quality as a base carrier in the electrical connection technology. The electrical connections are preferably routed by way of conductor paths in a plurality of planes of the circuit board which is of a great advantage in comparison to the flexible conductor foils that have only one wiring plane. In contrast to the classical control devices, which are known for example from EP 1 116 422 B1 and which arrange in a closed metal housing a multi-layer circuit boards having an electronic control circuit arranged thereon, the later transmission control modules use a conventional circuit board as a base carrier of the module even outside the region that is protected by means of metal or synthetic material housing parts. Modules of this type can be produced in a particularly cost-effective manner since inexpensive circuit board technology that is easy to master is used. A transmission control module of this type is known for example from the generic-forming DE 10 2007 029 913 A1. Since transmission control modules are installed in the transmission where they are exposed to the transmission fluid, parts of the circuit board that act as the base carrier are consequently also exposed to the aggressive transmission fluid. New construction and connection concepts are required if conventional circuit boards are to be used as a carrier in the electrical connection technology in the transmission fluid.

SUMMARY

The control module in accordance with the disclosure is based on the type of transmission control modules that are known from DE 10 2007 029 913 A1 that use as a base carrier a circuit board that comprises conductor paths that are arranged on at least one plane of the circuit board. Multi-layer circuit boards are preferably used. The circuit board can be either completely rigid or can also comprise flexible regions adjacent to regions of rigid, non-flexible conductor paths. An electronic control circuit that comprises discrete electrical components is in contact with the conductor paths of the circuit board. A bowl-shaped cover part is provided as a protection for the control circuit and said bowl-shaped cover part is arranged over the electronic control circuit and lies with a flange-like collar, which is arranged in parallel to a first face of the circuit board and comprises a planar contact region, in a sealing manner on the first face of the circuit board. The electronic control circuit is arranged in a protected manner in the housing inner chamber between the cover part and the circuit board. Outside the housing inner chamber that is covered by the cover part, the circuit board comprises contacts for contacting electrical components of the control module, for example plug connectors, sensors and actuators.

In an advantageous manner, at least one part of the electronic control circuit but in particular also the entire electronic control circuit is mounted on a carrier substrate that can be produced and tested independently from the circuit board. For example, the carrier substrate can be embodied as a ceramic carrier substrate, an LTCC (low temperature co-fired ceramic) substrate or a micro circuit board, wherein the electrical components that are part of the control circuit are contacted in an electrical manner by means of conductor paths and contacts of the carrier substrate. The contacts can be performed in a grid that is geometrically narrower and has smaller dimensions than on the circuit board of the module. It is in particular also possible to use a multi-layer substrate, for example a ceramic multi-layer substrate, wherein contact is provided by way of a plurality of layers of the carrier substrate. The electronic circuit that is created on the manageable carrier substrate can thus be produced and tested independently from the relatively large circuit board of the module. The carrier substrate on which the electronic circuit is provided can be contacted in a simple manner by the conductor paths of the circuit board. It is possible for this purpose to use for example bond wires that contact the contact sites on the carrier substrate by conductor paths or contact areas on a first face of the circuit board. However, the carrier substrate can also be soldered by means of solder contacts on the lower face directly to the conductor paths or contact areas on the circuit board. The carrier substrate having the circuit is thus arranged in a protected manner in a housing inner chamber between the bowl-shaped cover part and the circuit board.

In order in a most reliable manner possible to prevent transmission fluid from penetrating the housing inner chamber and damaging the electrical components, the housing inner chamber is filled with a flowable material which flows over the electrical components and the carrier substrate. Effective protection against small metal fragments and transmission fluid, for example aggressive oils, is ensured by virtue of the carrier substrate contacting the circuit board in the sealed housing inner chamber and the electrical connection being provided by means of the conductor paths on the circuit board.

Advantageous embodiments and further developments of the disclosure are possible by virtue of the features disclosed in the description below.

It is thus particularly advantageous if the flowable material fills to a great extent and preferably completely fills the part of the housing inner chamber that is not covered by the carrier substrate and the electrical components. In this case, not only is it not possible for the transmission fluid to penetrate the housing inner chamber but a heat-conducting contact is also produced by way of the flowable material between the components, which are arranged on the carrier substrate, and the cover part.

After the transmission control module has been produced and the switching functions have been tested, the flowable material can be introduced in an advantageous manner through at least one orifice that is provided in the cover part or in the circuit board. It is naturally also possible to provide a plurality of orifices. The orifice can finally be sealed using a sealing element. The flowable material can also be a material that is initially fluid as it is introduced in and then subsequently hardens. It can in particular also be a heat-conducting material. It is preferred that a heat-conducting fluid or a heat-conducting gel is used. The orifice also has the advantage that as the connection between the cover part and the circuit board is produced an exchange of air between the housing inner chamber and the atmosphere can occur as heat is introduced and the cover part is prevented from bursting open.

In order to improve the heat conduction it is possible to arrange a cooling body over the cover part, which cooling body is directly or indirectly contacted in a heat conducting manner by the cover part. This cooling body can also be part of a base body of the control module.

The sealable orifice can be provided in a particularly simple manner in the cover part and can be sealed by means of a press-in part as a sealing element that is pressed in and is in particular ball-shaped. This is particularly advantageous in combination with a metal cover part. However, the cover part can also be embodied as a synthetic material part.

It is provided in an exemplary embodiment that the sealable orifice is provided in the circuit board in the form of a through connection that is provided with a central through-going cut-out. This through connection can be provided in an advantageous manner during the production of the circuit board and does not require any additional expenditure. The sealing element can be inserted in a simple manner in the form of solder into the central through-going cut-out after the heat-conducting material has been introduced in.

In an advantageous exemplary embodiment, a metallic base plate is mounted on the second face of the circuit board that is remote from the cover part. In order to improve the heat conduction the carrier substrate can then be mounted within a cut-out on the metal base plate, which cut-out is provided in the circuit board. The heat that is generated by the electrical components on the carrier substrate is then additionally dissipated by way of the carrier substrate to the metal base plate.

A method for producing a control module having the following steps is of further advantage:

Provide a carrier substrate that is provided with an electronic control circuit, Mount the carrier substrate on a circuit board or mount the carrier substrate within a cut-out in a circuit board on a metal base plate that is contacted by the circuit board, Produce an electrical connection between the electronic control circuit on the carrier substrate and the conductor paths or contact areas of the circuit board, Place a bowl-shaped cover part over the electronic control circuit so that the bowl-shaped cover part lies with a planar contact area on a first face of the circuit board to produce a circumferential sealed connection, Introduce a heat-conducting material through an orifice in the cover part or in the circuit board into the housing inner chamber that is formed between the cover part and the circuit board and Seal the orifice with a sealing element.

The method is particularly cost-effective and simple to implement since the electronic circuit that is located on the carrier substrate can be tested in advance and it is possible in a relatively simple automated manner to arrange the carrier substrate and the cover part on the circuit board at the same time as the subsequent procedure of filling the housing inner chamber.

It is possible in an advantageous manner even prior to the method step of introducing the heat-conducting material by way of the at least one orifice in the cover part or the circuit board to first perform a leak test on the housing inner chamber by means of applying an overpressure or an underpressure.

BRIEF DESCRIPTION OF THE DRAWINGS

Exemplary embodiments of the disclosure are illustrated in the drawings and are explained in detail in the following description. In the drawings:

FIG. 4 shows a partial cross-sectional view through a third exemplary embodiment of a control module in accordance with the disclosure, FIG. 5 shows a partial cross-sectional view through a fourth exemplary embodiment of a control module in accordance with the disclosure.

DETAILED DESCRIPTION

Figure 1:
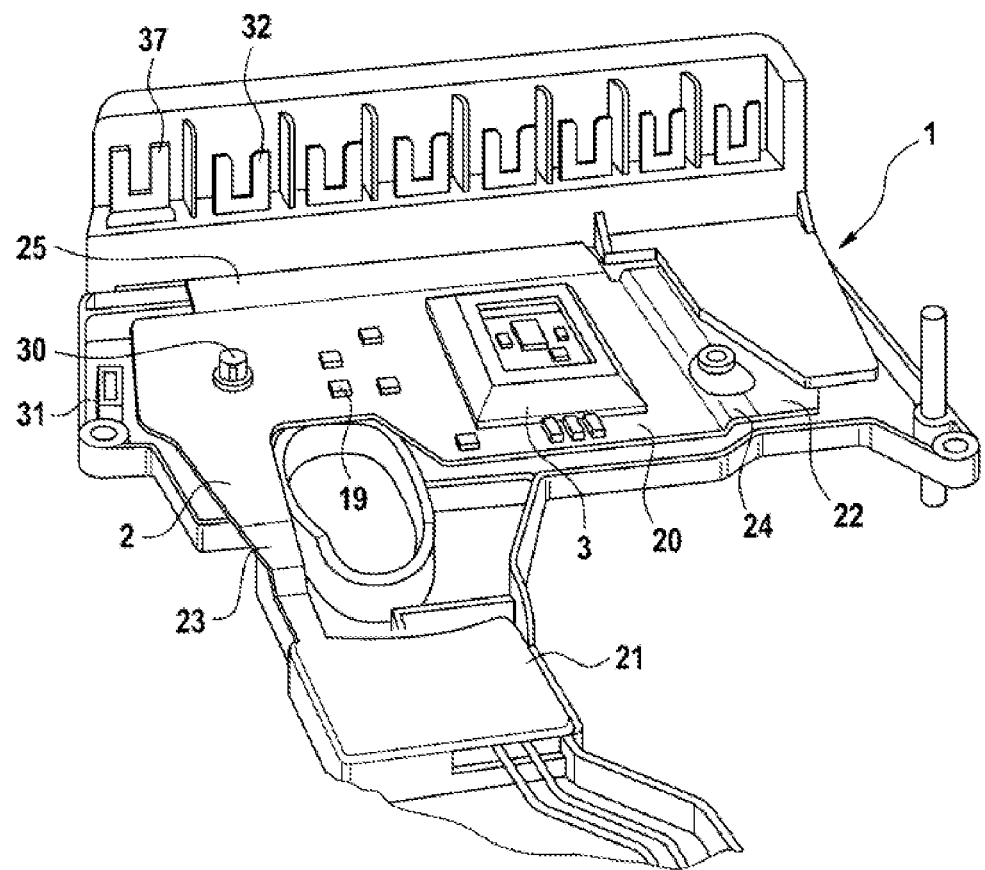
FIG. 1 shows the principal construction of an exemplary embodiment of the transmission control module having a flexible-rigid circuit board.

FIG. 1 illustrates schematically a control module that can be installed preferably in the automatic transmission of a motor vehicle. Although the control module is explained here using as an example a transmission control module, said control module can also be used to control other equipment assemblies, wherein the control module is naturally tailored to suit the basic conditions as required in each case, such as the number and type of actuators that are to be controlled, sensors and plug connections. The transmission control module 1 that is illustrated here comprises for example a complex synthetic material part as a base body 1, wherein contact elements 32 in the form of metal blade contacts can be provided directly in the base body 1 for contacting actuators, for example electro-hydraulic pressure control valves. A circuit board 2 that acts as the base carrier in the electrical connection technology is arranged on the base body 1. The circuit board 2 is used to electrically connect the different electrical components of the module, such as actuators, sensors and plug connectors to a central control device. The circuit board 2 is, for example, a conventional circuit board that is embodied from a glass-fiber reinforced epoxide resin or a similar material. In particular FR4 substrates or circuit board substrates of a higher quality can be used. The base body 1 can be omitted if the circuit board assumes the mechanical fastening function of said base body and all the components of the control module are fastened directly to the circuit board.

The circuit board 2 in the exemplary embodiment shown in FIG. 1 comprises at least one rigid, non-flexible region where the control circuit is arranged. The term 'a rigid circuit board' is understood in the context of the application to mean a circuit board that comprises approximately the elasticity of a conventional circuit board on an FR4 basis. Flexible conductor foils, also called flex foils, are included in this. In contrast to the rigid circuit boards, flexible conductor foils are completely elastic and comprise in each part region a high level of flexibility and pliability. However, the term 'circuit board' is also intended to cover a so-called flexible-rigid circuit board that comprises both rigid regions and also flexible or rather elastically formable regions. Flexible-rigid circuit boards of this type are known in the trade and are described by way of example in the "*Handbuch der Leiterplattentechnik, Band 2 Neue Verfahren, Neue Technologien*" [Manual for Circuit Board Technology, Vol. 2 New methods, New Technologies], Eugen G. Leuze Verlag 1991, Saulgau Württemberg, page 99 and following.

It is further evident in FIG. 1 that the circuit board 2 comprises a central rigid region 20 that is connected by way of flexible regions 23, 24, 25 of the circuit board 2 to further rigid circuit board regions 21 and 22. An additional rigid region 37 of the circuit board 2 can be accommodated in the base body 1 for example in order to contact an actuator. The circuit board 2 is provided in the central rigid region 20 with a control device 3 as is further explained hereinunder with reference to the FIGS. 3 to 7. FIG. 1 illustrates that electrical components are fitted to the circuit board outside the part of the circuit board which part is provided with the control device 3. Said electrical components are, for example, sensors 30, individual electrical components 19 or internal plug connections 31. However, the metal contact elements 32 of the actuators are also connected to a rigid region, not illustrated in FIG. 1, of the circuit board 2, which rigid region is connected by way of a further flexible region 25 to the central region 20.

The circuit board 2 comprises conductor paths that are routed in at least one plane of the circuit board 2. However, particularly preferred is a multi-layer circuit board in which conductor paths are routed over a plurality of parallel planes and/or layers on the two outer faces of the circuit board and in particular also on the inner intermediate layers. The conductor paths on different layers are mutually connected in a known manner by way of so-called through-connections or vias (electrical interconnections). In the case of the flexible-rigid circuit boards the multi-layer routing of the circuit boards can be limited only to the rigid regions whereas the flexible regions can comprise conductor paths in only one layer. However, the circuit board 2 can also comprise conductor paths in only one layer of the circuit board 2, for example on an outer face, which conductor paths are covered for example by a protective lacquer. The integration of the conductor paths in the circuit board or the provision of the protective lacquer coating ensures that the conductor paths are effectively protected against small metal fragments and transmission fluid.

Figure 2:
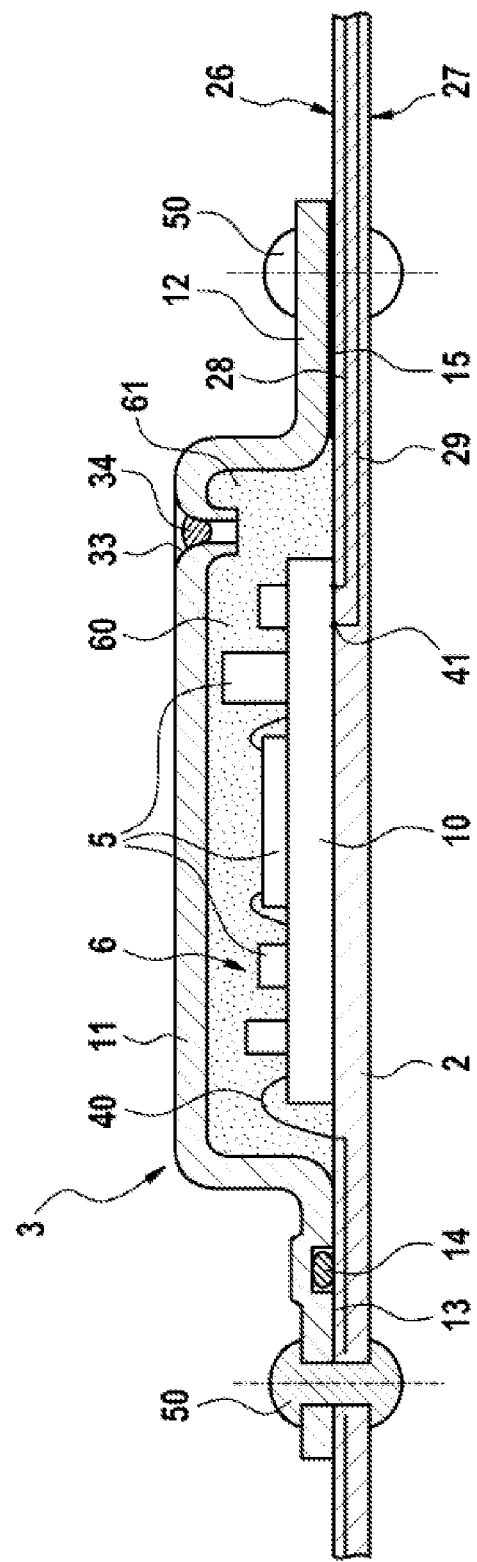
FIG. 2 shows a partial cross-sectional view through a first exemplary embodiment of a control module in accordance with the disclosure.

FIG. 2 shows a schematic cross-sectional illustration of the central part of the circuit board 2 with the control device 3. The circuit board 2 comprises a first face 26 and a second face 27 that is remote from said first face. It is evident in FIG. 2 that the circuit board 2 is a multi-layer circuit board. This is indicated schematically by means of two conductor paths 28 and 29 that are routed on different layers of the circuit board and are arranged in planes that are parallel with respect to the longitudinal extension of the circuit board 2, wherein the conductor path 29 for example is arranged on an inner layer of the circuit board and the conductor path 28 is arranged for example on the outer face. Furthermore the figure illustrates a carrier substrate 10 that is produced independently from the circuit board 2. The carrier substrate 10 is used as a carrier of a part of the electronic control circuit 6, preferably as a carrier for the entire control circuit 6. For this purpose, the separate electrical components 5 of the control circuit are fitted individually on the carrier substrate where they are contacted by conductor paths, not illustrated, of the carrier substrate 10. This contact can be performed in a known manner by means of wire bonds, reflow-soldering or a conductive adhesive or in any other suitable manner. The carrier substrate 10 is for example a ceramic carrier substrate in particular an LTCC (low temperature co-fired ceramic) substrate or a micro circuit board. The electrical components 5 that are a part of the control circuit 6 are contacted in an electrical manner by means of the conductor paths, not illustrated, and contacts of the carrier substrate 10. The carrier substrate can in particular also be a multi-layer substrate, for example a ceramic multi-layer substrate, in which the electrical connection is performed by means of conductor paths in multiple parallel planes that are electrically mutually connected by way of so-called vias (interconnectors). It is particularly advantageous that the carrier substrate 10 together with the circuit 6 can be produced in advance and its function can be tested prior to the circuit board 2 being assembled.

As is further illustrated in FIG. 2, the carrier substrate 10 together with the circuit 6 that is arranged on said carrier substrate is mounted on the first face 26 of the circuit board 2. In particular, it is possible to simply adhere the carrier substrate 10 to the first face 26 and to connect individual contacts of the carrier substrate 10 by way of bond wires 40 to the conductor paths on the first face 26 or to the contact areas on the first face 26 that are in turn connected by means of vias to the inner conductor paths of the circuit board. However, it is also possible to provide the carrier substrate 10 on the lower face that is remote from the circuit 6 with solder contacts 41, which solder contacts are contacted by the electronic control circuit 6 by way of vias that are provided in the carrier substrate 10, and to solder the carrier substrate 10 to the solder contacts 41 on the conductor paths and/or contact areas on the first face 26 of the circuit board 2, as is illustrated in the right-hand region of the carrier substrate 10 in FIG. 2.

After the carrier substrate 10 has been mounted on the circuit board 2 and the electrical contact between the carrier substrate and the circuit board has been produced, a bowl-shaped cover part 11, as illustrated in FIG. 2, is placed on the circuit board 2. The cover part 11 can be embodied from metal or synthetic material and can be embodied in a cost-effective manner for example as a deep-drawn part, pressure die-cast part or injection molded part. The cover part 11 comprises a circumferential flange-like collar 12 that comprises an extensively planar support surface 13 on its lower face that faces the circuit board 2. It is possible to provide in this planar contact surface 13 a groove for a circumferential seal, for example a sealing ring 14, as is illustrated in the left-hand part of FIG. 2. The sealing ring 14 can also comprise an elastomer seal. However, it is also possible to adhere the planar support surface 13 to the first face by means of a circumferential sealing adhesive connection 15. However, it is also possible to use a simple sealing compound in place of a sealing adhesive connection if the cover part is fastened to the circuit board by means of additional mechanical fastening means.

It is further possible in order to mechanically fasten the cover part 11 to the circuit board 2 to fasten the cover part 11 to the circuit board by means of additional mechanical fastening means. In particular, it is possible to fasten the cover part 11 to the circuit board for example by means of rivets 50 or screws in the region of the flange-like collar 12, as illustrated in FIG. 2. However, it is also possible to provide the first face 26 of the circuit board with a circumferential conductor path that is embodied from, for example, copper and to solder a metal cover part onto this circumferential conductor path. Furthermore, it is also feasible to embody the cover part from a synthetic material and to provide synthetic material spigots that are fastened into the through-going orifices of the circuit board 2 by means of warm-caulking. It is likewise possible to use latching connections or snap-fit connections or other fastening means in order to fasten the cover part to the circuit board 2 in a mechanical manner. The longitudinal coefficients of expansion of the circuit board and the cover part can be selected such that as little as possible thermal stresses occur under alternating temperature loadings. The cover part 11 forms an effective protection of the control circuit 6 with respect to small metal fragments that can occur in the hydraulic fluid of the transmission.

Once the cover part 11 has been fastened in place, it is possible if desired for example to perform by way of an orifice 33 in the cover part 11 a leak test on the housing inner chamber 60 that is formed between the cover part 11 and the circuit board 2. For this purpose, the housing inner chamber 60 is influenced by means of an overpressure or underpressure by way of the orifice 33, wherein in particular the leak-tightness at the site of the sealing ring 14 and/or the sealing adhesive connection 15 is tested. It is preferred that the housing inner chamber 60 is hermetically sealed.

However, the orifice 33 is also used to introduce a flowable material 61 into the housing inner chamber 60. The flowable material 61 is applied over the carrier substrate 10 onto the electrical components 5 and preferably fills the entire housing inner chamber 60. The flowable material is preferably a chemically neutral material that does not attack the electrical components 5 and the contacts of the carrier substrate 10. In this case, in particular gels and fluids are used, wherein the electronic circuit 6 can be coated in addition with an insulating protective lacquer or for example an electrically non-conductive material 61 is applied to the components 5. The flowable material in the housing inner chamber prevents transmission fluid from penetrating the housing inner chamber and prevents the electronic circuit from being contaminated.

Figure 3:
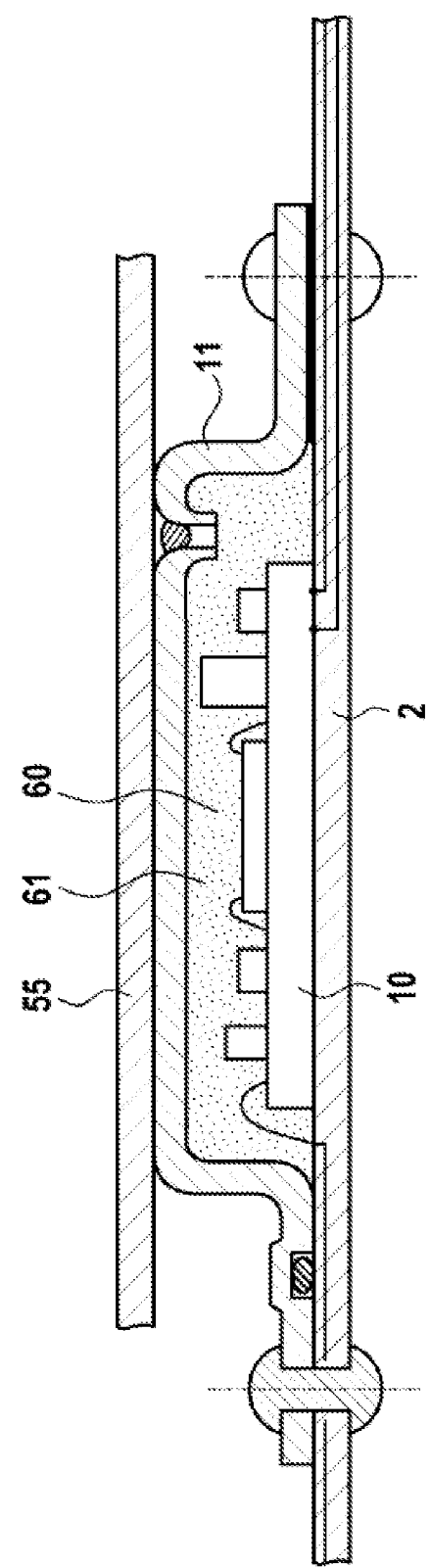
FIG. 3 shows a partial cross-sectional view through a second exemplary embodiment of a control module in accordance with the disclosure.

It is preferred that the flowable material 61 is a heat-conducting material, in particular a heat-conducting gel. If the housing inner chamber 60 is filled preferably completely with the heat-conducting material, as is illustrated in FIG. 2, then this results in a good heat-conducting contact between the electronic circuit 6 and the cover part 11. Heat that is generated during the operation is then discharged at least partially from the circuit 6 by way of the heat-conducting material 61 to the cover part 11. In order to improve this dissipation of heat it is further advantageous to provide a cooling body 55 over the cover part 11, as illustrated in FIG. 3. The cooling body 55 can be a metal plate that is connected in a heat-conducting manner directly or indirectly to the cover part 11 by way of a heat-conducting material. The cooling body 55 can for example be part of the base body 1 of the transmission control module.

Figure 7:
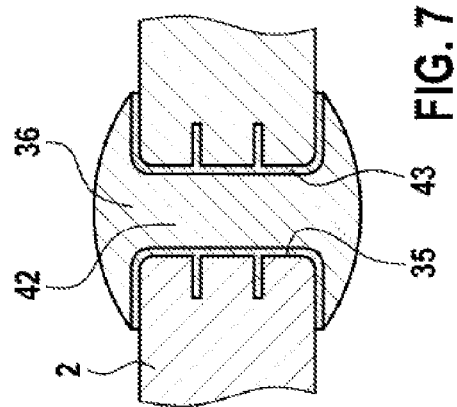
FIG. 7 shows an enlarged detailed view of a circuit board through-connection that is sealed by means of solder in the case of the exemplary embodiments as shown in FIGS. 4 to 6.

A further exemplary embodiment of a control module in accordance with the disclosure is illustrated in FIG. 4, wherein hereinunder only the differences with respect to FIG. 2 are mentioned. In the case of the exemplary embodiment in FIG. 4, the orifice 35 is provided for the purpose of introducing the flowable material 61 not in the cover part 11 but in the circuit board 2. The orifice 35 can be provided in a particular simple manner by means of the through-connection 43 in the circuit board 2. An enlarged illustration of the through-connection 43 is evident in FIG. 7. Through-connections are used in a multi-layer circuit board for contacting conductor paths on different layers of the multi-layer circuit board. Through-connections are already provided during the usual process of producing of rigid circuit boards of this type so that no additional expenditure is required for the production process. The through-connection 43 comprises an electrically conductive coating for example of copper that is applied to the inner wall of a through-going cut-out 42 and is provided with solder lands on the first face 26 and the second face 27 of the circuit board. Two inner layers that are connected by the through-connection 43 are indicated in FIG. 7. However, the through-connection 43 can also be tailored to suit specific requirements. Thus, the diameter of the solder lands can be increased in order to improve the adhesive connection to the circuit board and the inner layers of the circuit board can be connected to the through-connection in order to achieve a labyrinth-like sealing arrangement.

A leak test can be performed on the housing inner chamber 60 by way of the through-going cut-out 42 that is initially open. It is likewise possible to introduce the flowable material through the through-going cut-out 42, for example using a dispensing device. After the housing inner chamber has been filled, a sealing element 36 in the form of solder is introduced into the through-going cut-out 42. For this purpose, soft solder can be applied in spots to the second face 27 of the circuit board 2, wherein the solder melts as heat is supplied and said solder is drawn into the through-going orifice 42. The through-going orifice 42 can naturally also be sealed in a different manner.

FIG. 5 illustrates an exemplary embodiment in which in addition to the exemplary embodiment illustrated in FIG. 4 a metal plate 70 that is embodied for example from aluminum is mounted on the second face 27 of the circuit board 2. Said metal plate can be mounted directly on said second face or it can be connected by means of an adhesive connection, soldering laminates thereon or using other techniques. The metal plate 70 comprises a cut-out 71 that renders access to the orifice 35 possible, so that the housing inner chamber in this embodiment can also be filled through an orifice in the circuit board 2. Furthermore, the circuit board 2 comprises a cut-out 17. The carrier substrate 10 together with the electronic control circuit 6 is mounted within this cut-out 17 on the metal plate 70, for example by means of adhesive or solder. The contact between the circuit board 2 and the carrier substrate 10 is achieved in this case preferably by way of bond wires. In the case of this exemplary embodiment, the housing inner chamber 61 is formed by virtue of the region between the inner face of the cover part 11 and the lower face of the circuit board 2, which lower face is formed by the second face of the circuit board 2. In the context of the application, the housing inner chamber that is formed between the cover part and the circuit board is therefore understood to mean the region between the inner face of the cover part and the second face 27 of the circuit board 2, which second face is remote from the cover part. The exemplary embodiment in FIG. 5 comprises the advantage that the heat that is generated by the components 5 of the circuit 6 is not only dissipated by way of the heat-conducting material 61 into the cover part 11 but it can also be discharged by way of the carrier substrate 10 to the metal plate 70.

Figure 6:
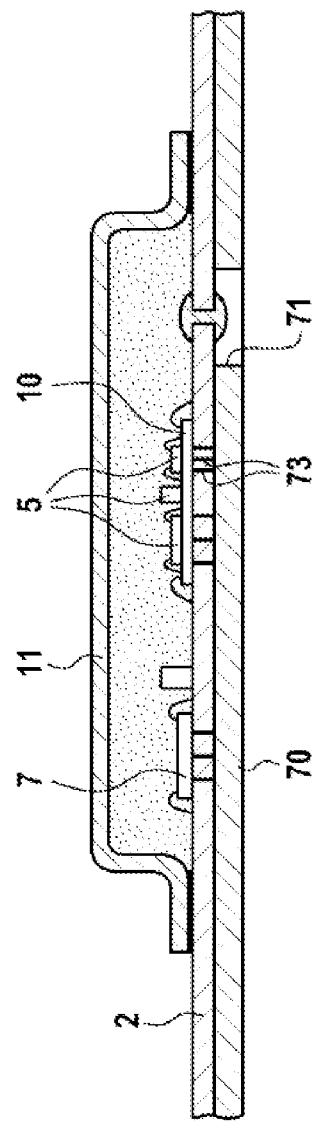
FIG. 6 shows a partial cross-sectional view through a fifth exemplary embodiment of a control module in accordance with the disclosure.

A further exemplary embodiment is illustrated in FIG. 6. In this exemplary embodiment, the carrier substrate 10 is mounted on the first face 26 of the circuit board as is the case in the exemplary embodiment shown in FIG. 2. However, only a part of the electronic control circuit is arranged on the carrier substrate. A metal plate 70 is mounted on the second face 27 of the circuit board 2. The plate 70 can for example be adhered to the circuit board or soldered thereto. Through-connections 73 in the circuit board 2 improve the dissipation of heat if the heat that is discharged by components on the carrier substrate 10 passes by way of the carrier substrate 10 and the through-connections 73 to the second face 27 of the circuit board 2 and from there passes to the metal plate 70. The through-connections can for this purpose be filled with solder. In this exemplary embodiment, in addition to the carrier substrate 10, further components 7 that are a part of the electronic control circuit 6 are fitted directly to the circuit board 2 within the housing inner chamber 61 that is formed by the cover part 11 and the circuit board 2. The heat generated by these components 7 can also be discharged by way of the through-connections of the circuit board 2 to the metal plate 70. The electrical connection to the carrier substrate 10 is produced by way of conductor paths of the circuit board 2 and bond wires.

The invention claimed is:

1. A control module, comprising:
a circuit board configured as a base carrier, the circuit board including conductor paths arranged at least on one plane of the circuit board, and the circuit board including at least one rigid, non-flexible conductor path region;
an electronic control circuit electrically contacted by the conductor paths of the circuit board, the electronic control circuit including electrical components; and
a bowl-shaped cover part configured as a protection for the electronic control circuit and arranged at least over a part of the electronic control circuit, the cover part including a planar contact region aligned in parallel to a first face of the circuit board and lying in a sealing manner on the first face of the circuit board,
wherein at least a part of the electronic control circuit is arranged in a protected manner in a housing inner chamber formed between the cover part and the circuit board,
wherein electrical contacts of the circuit board are provided outside the housing inner chamber that is covered by the cover part in order to contact the electrical components of the control module,
wherein at least one part of the electronic control circuit is arranged on a carrier substrate arranged in the housing inner chamber,
wherein the carrier substrate is electrically contacted by the conductor paths or contact areas of the circuit board,
wherein a flowable material is applied over the carrier substrate onto the electrical components within the housing inner chamber, and
wherein the flowable material completely fills the housing inner chamber except for volume that is occupied by the carrier substrate and the electrical components.

2. The control module as claimed in claim 1, further comprising at least one orifice configured to be sealed by a sealing element, the at least one orifice provided in at least one of the cover part and the circuit board to introduce heat-conducting material.

3. The control module as claimed in claim 1, wherein the flowable material is configured to conduct heat and is configured to form a heat-conducting contact between the electrical components and the cover part.

4. The control module as claimed in claim 1, further comprising a cooling body in heat-conducting contact with the cover part, the cooling body arranged over the cover part.

5. The control module as claimed in claim 2, wherein:
the at least one orifice is provided in the cover part, and
the sealing element includes a press-in part that is ball-shaped and is configured to be pressed into the at least one orifice.

6. The control module as claimed in claim 2, wherein:
the at least one orifice is formed as at least one through-connection having a central through-going cut-out in the circuit board, and
the sealing element is solder applied into the central through-going cut-out of the at least one through-connection.

7. The control module as claimed in claim 1, wherein the carrier substrate is a multi-layer substrate.

8. The control module as claimed in claim 1, wherein the carrier substrate is fastened to the first face of the circuit board.

9. The control module as claimed in claim 1, further comprising:
a metal base plate mounted on a second face of the circuit board,
wherein the carrier substrate is mounted within a cut-out on the metal base plate, and
wherein the cut-out is provided in the circuit board.

10. A method for producing a control module, comprising:
mounting a carrier substrate having an electronic control circuit on a circuit board or within a cut-out in the circuit board on a metal base plate that is connected to the circuit board;
producing an electrical connection between the electronic control circuit on the carrier substrate and conductor paths or contact areas on the circuit board;
placing a bowl-shaped cover part over the electronic control circuit so that the bowl-shaped cover part lies with a planar contact area on a first face of the circuit board to produce a circumferential sealed connection;
introducing a flowable material through at least one orifice in the cover part or in the circuit board into a housing inner chamber that is formed between the cover part and the circuit board to completely fill the housing inner chamber except for volume that is occupied by the carrier substrate and electrical components of the electronic control circuit; and
sealing the at least one orifice with a sealing element.

11. The method as claimed in claim 10, further comprising performing a leak test on the housing inner chamber by applying an overpressure or an underpressure prior to introducing the flowable material through the at least one orifice.

* * * * *